United States Patent
Lehmann et al.

(10) Patent No.: US 12,227,870 B2
(45) Date of Patent: Feb. 18, 2025

(54) FUSED QUARTZ CRUCIBLE FOR PRODUCING SILICON CRYSTALS, AND METHOD FOR PRODUCING A FUSED QUARTZ CRUCIBLE

(71) Applicant: SILTRONIC AG, Munich (DE)

(72) Inventors: Toni Lehmann, Oederan (DE); Dirk Zemke, Ach (AT)

(73) Assignee: SILTRONIC AG, Munich (DE)

(*) Notice: Subject to any disclaimer, the term of this patent is extended or adjusted under 35 U.S.C. 154(b) by 176 days.

(21) Appl. No.: 17/796,902

(22) PCT Filed: Jan. 27, 2021

(86) PCT No.: PCT/EP2021/051798
§ 371 (c)(1),
(2) Date: Aug. 2, 2022

(87) PCT Pub. No.: WO2021/156114
PCT Pub. Date: Aug. 12, 2021

(65) Prior Publication Data
US 2023/0109724 A1    Apr. 13, 2023

(30) Foreign Application Priority Data
Feb. 3, 2020 (DE) ............ 10 2020 000 701.5

(51) Int. Cl.
*C30B 15/10* (2006.01)
*C03B 20/00* (2006.01)
(Continued)

(52) U.S. Cl.
CPC ............. *C30B 15/10* (2013.01); *C03B 20/00* (2013.01); *C03C 17/004* (2013.01); *C03C 17/02* (2013.01);
(Continued)

(58) Field of Classification Search
CPC ..... C03B 19/066; C03B 20/00; C03C 17/004; C03C 17/02; C03C 2217/91; C03C 2218/345; C30B 15/10; C30B 35/002
See application file for complete search history.

(56) References Cited

U.S. PATENT DOCUMENTS 5,790,315 A * 8/1998 Fujinoki ............ C03B 32/00
                                                          359/652
2001/0032580 A1* 10/2001 Phillips .............. C30B 29/06
                                                          117/13
(Continued)

FOREIGN PATENT DOCUMENTS

| CN | 101956230 A | 1/2011 |
| CN | 101970727 A | 2/2011 |

(Continued)

*Primary Examiner* — Matthew J Song
(74) *Attorney, Agent, or Firm* — BROOKS KUSHMAN P.C.

(57) ABSTRACT

A fused quartz crucible for pulling a single crystal of silicon by the Czochralski technique, has an inner side with an inner layer of fused quartz that forms a surface, the inner layer being provided with a crystallization promoter which on heating of the fused quartz crucible during use, in crystal pulling, causes crystallization of fused quartz to form b-cristobalite, wherein the concentration C of synthetically obtained $SiO_2$ at a distance d from the surface is greater than the concentration of synthetically obtained $SiO_2$ at a distance d2 from the surface, where d2 is greater than d. Multiple crystals can be grown while maintaining high crystal quality.

19 Claims, 4 Drawing Sheets

(51) Int. Cl.
  *C03C 17/00*   (2006.01)
  *C03C 17/02*   (2006.01)
  *C30B 29/06*   (2006.01)

(52) U.S. Cl.
  CPC .......... *C30B 29/06* (2013.01); *C03C 2217/91* (2013.01); *C03C 2218/345* (2013.01)

(56) References Cited

U.S. PATENT DOCUMENTS

| | | | |
|---|---|---|---|
| 2006/0144327 A1* | 7/2006 | Ohama | C30B 15/10 117/200 |
| 2006/0236916 A1* | 10/2006 | Ohama | C30B 29/06 117/200 |
| 2006/0281283 A1* | 12/2006 | Yoshida | C30B 29/06 438/478 |
| 2011/0017128 A1 | 1/2011 | Harada et al. | |
| 2011/0272322 A1 | 11/2011 | Yamagata et al. | |
| 2012/0137964 A1* | 6/2012 | Sudo | C30B 15/10 117/208 |
| 2019/0145019 A1 | 5/2019 | Kishi et al. | |

FOREIGN PATENT DOCUMENTS

| | | |
|---|---|---|
| DE | 102012011793 A1 | 12/2013 |
| EP | 0748885 A1 | 12/1996 |
| EP | 2460911 A1 | 6/2012 |
| EP | 2460913 A1 | 6/2012 |
| JP | H09110590 A | 4/1997 |
| JP | 2005060152 A | 3/2005 |
| TW | I275669 B | 3/2007 |
| TW | I405728 B | 8/2013 |
| WO | 03089693 A1 | 10/2003 |

* cited by examiner

Fig. 2
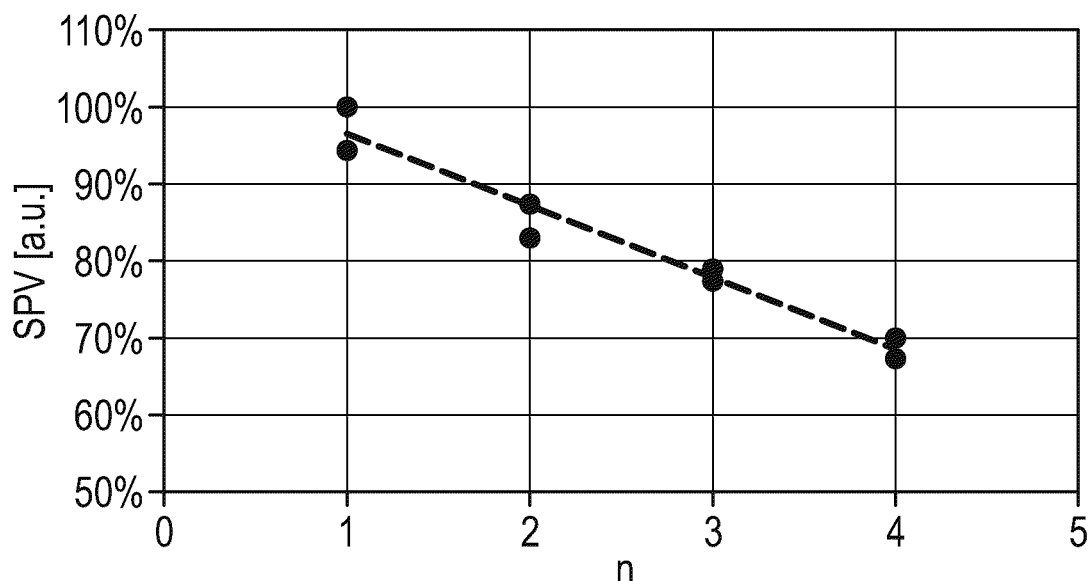
Fig. 2a
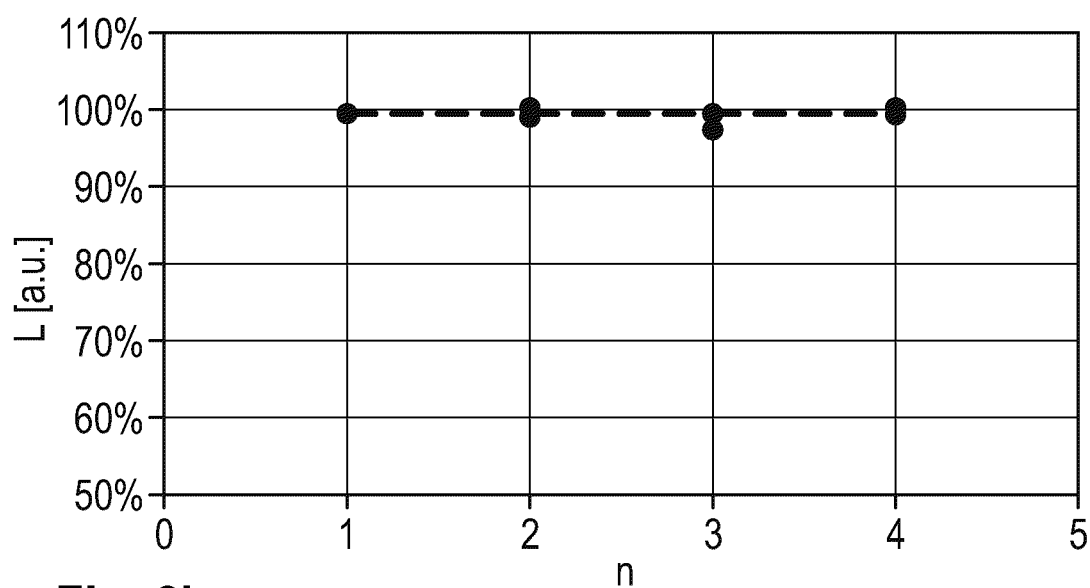
Fig. 2b

Fig. 3
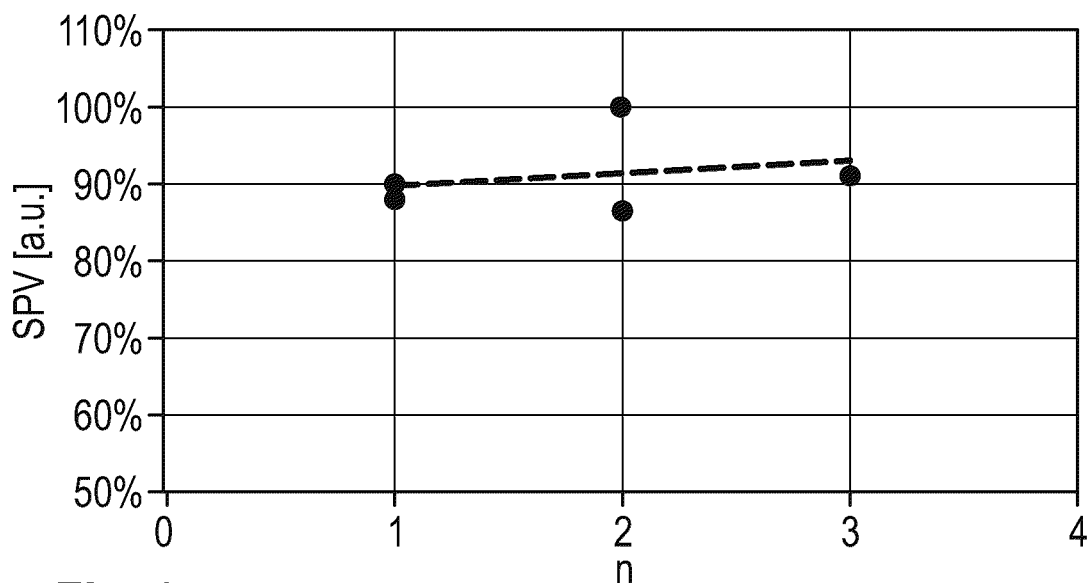
Fig. 3a
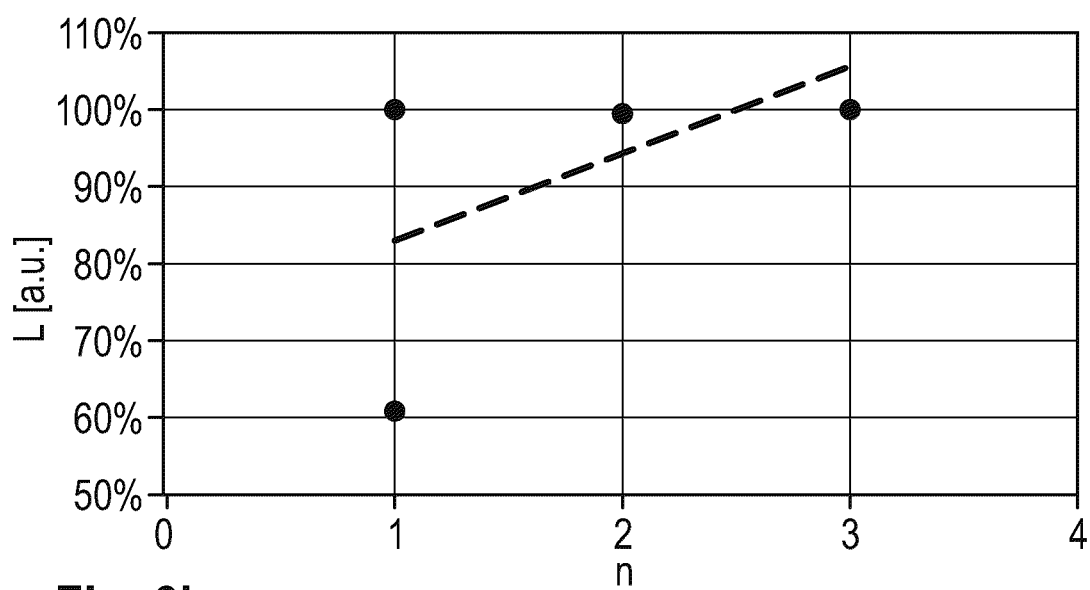
Fig. 3b

Fig. 4
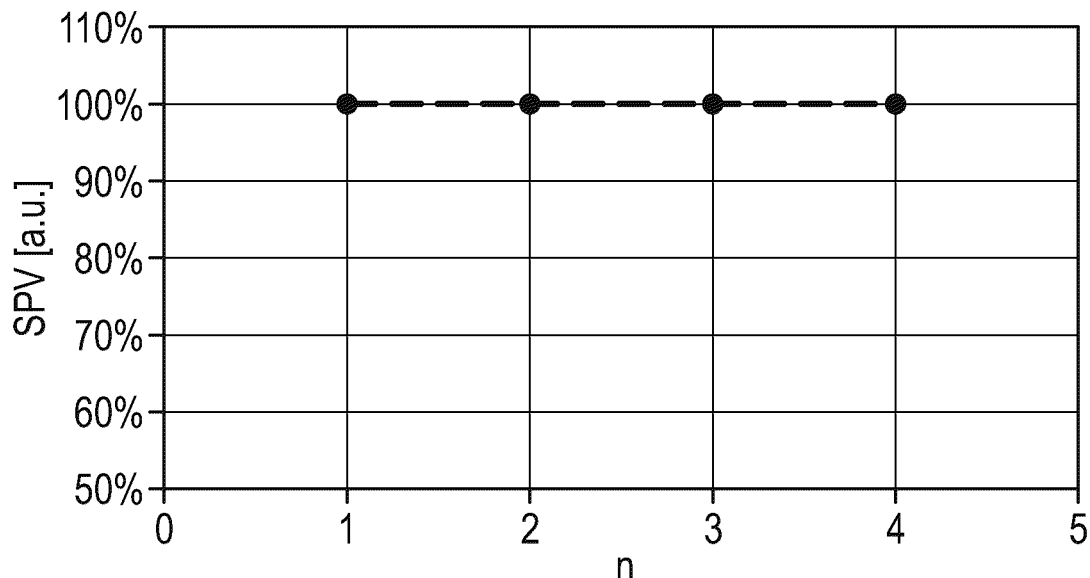
Fig. 4a
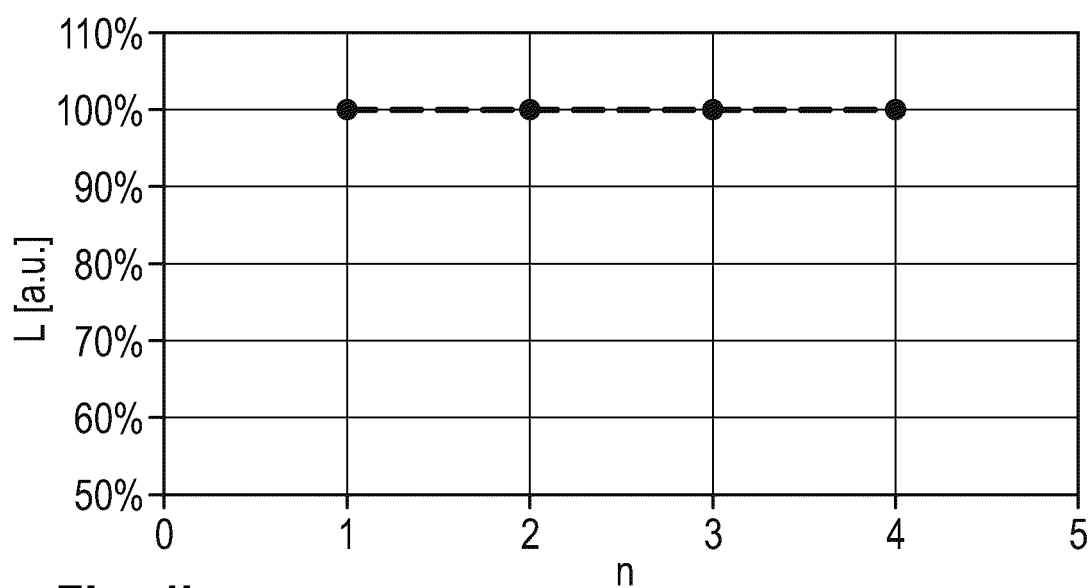
Fig. 4b

FUSED QUARTZ CRUCIBLE FOR PRODUCING SILICON CRYSTALS, AND METHOD FOR PRODUCING A FUSED QUARTZ CRUCIBLE

CROSS REFERENCE TO RELATED APPLICATIONS

This application is the U.S. National Phase of PCT Appln. No. PCT/EP2021/051798 filed Jan. 27, 2021, which claims priority to German Application No. 10 2020 000 701.5 filed Feb. 3, 2020, the disclosures of which are incorporated in their entirety by reference herein.

BACKGROUND OF THE INVENTION

1 Field of the Invention

The invention relates to a fused quartz crucible for crystal pulling, having a crucible wall. The invention further relates to a technique for pulling a crystal, using this crucible, by the Czochralski process.

2. Description of the Related Art

Fused quartz crucibles are used, for example, for holding the metal melt in the pulling of single crystals according to the process known as the Czochralski process. In this process, a seed crystal with predetermined orientation is immersed into the melt and then slowly pulled upward. During this procedure, the seed crystal and the melt rotate in opposite directions. As a result of the surface tension between the seed crystal and the melt, melt is pulled off with the seed crystal as well, and this melt gradually cools and so solidifies to form a continually further-growing single crystal.

The ingots that have been pulled can be used for cutting into semiconductor wafers by mechanical methods such as a wire saw, for example. After subsequent polishing, the wafers obtained in this way, after an optional step of epitaxy, can be used for the fabrication of electronic components.

In the course of the crystal pulling operation, the fused quartz crucible is subject over several hours to high mechanical, chemical, and thermal loads, which it has to withstand without significant plastic deformation. The larger the crucible and hence the greater the volume of melt to be accommodated in it, the longer, in general, are the melting times.

In order to increase the thermal stability of the fused quartz crucible, a proposal is made in EP 07 48 885 A1 that said crucible be provided with a surface layer of cristobalite. The melting point of cristobalite, at about 1720° C., is markedly above the melting temperatures of typical semiconductor materials (in the case of a silicon melt, for example, the melting temperature is around 1420° C.). To generate the cristobalite surface layer, the glassy outer wall of a standard commercial crucible of opaque fused quartz, containing bubbles, is treated with a chemical solution comprising substances which promote the devitrification of fused quartz, to form cristobalite ("crystallization promotors"). Recommended crystallization promoters are essentially compounds of boron, of alkaline earth metals, and of phosphorus; preference is given to using barium hydroxide. When the fused quartz crucible is heated to a temperature above 1420° C.—during service in the crystal pulling operation, for example—the pretreated crucible wall undergoes superficial crystallization to form cristobalite, and this contributes to a greater mechanical and thermal strength on the part of the fused quartz crucible.

The specification EP 1 497 484 A1 describes a fused quartz crucible for crystal pulling, having a crucible wall, comprising an outer layer of opaque fused quartz and an inner layer, where the outer layer has an internal region and an external region which is provided with a crystallization promoter which, on heating of the fused quartz crucible in the course of its designated use in crystal pulling, produces a crystallization of fused quartz to form cristobalite. The crystallization promoter comprises a first component which act as a network former in fused quartz—in addition to silicon—and/or which acts as a network modifier in fused quartz, and a second component, which acts as a separating-point former in fused quartz and which is free from alkali metal.

The patent specification U.S. Pat. No. 2,019,145 019 A1 describes the thickness of the crystallization accelerator-containing coating films as being preferably 0.3 to 100 micrometers. Accordingly, the barium concentration applied thereto is controlled by changing the thickness of the crystallization accelerator-containing coating films. It should be borne in mind that elements which are able to act as crystallization accelerators are not intentionally added to the fused quartz crucible body, and if the crucible body consists, for example, of natural quartz flour, it is preferential for the barium concentration to be less than 0.10 ppm, the magnesium concentration less than 0.10 ppm, and the calcium concentration less than 2.0 ppm. Where synthetic quartz flour is used as a raw material for the internal surface of the crucible body, it is preferential for the concentrations both of magnesium and of calcium in the crucible body to be less than 0.02 ppm.

The inventors have recognized that the use of the crucibles produced according to the present state of the art continues to be impacted by disadvantages. In particular, the pulling of a number of crystals from a crucible frequently involves damage, since the crystals have an increased dislocation rate and can therefore not be used, or can be used only partially, for the semiconductor industry. The inventors have also recognized that the long time over which a crucible is subject to high temperatures leads to dislocations. This is the case especially with large diameters and high weighed inputs. Precisely under such conditions, however, it would be particularly attractive from an economic standpoint to be able to use crucibles which did not exhibit the stated disadvantages.

It is found, moreover, that crystals pulled in succession from a crucible exhibit significant differences in quality. For example, there is a drop in the characteristic mean free path length of the minority charge carriers of the crystals, as the number of crystals already pulled from a crucible goes up. These differences in quality according to the number of crystals already pulled from a crucible are unacceptable for the semiconductor industry.

The problems described were the basis for the objective of the invention, namely to provide quartz crucibles which do not develop the stated disadvantages in crystal pulling. A further object is to provide methods for producing suitable quartz crucibles.

The object of the invention is achieved by means of the methods and products described herein and in the claims.

The features that are stated with regard to the below-detailed embodiments of the method of the invention can be transposed correspondingly to the product according to the invention. Conversely, the features stated with regard to the below-detailed embodiments of the product according to the invention can be transposed correspondingly to the method of the invention. These and other features of the embodiments of the invention are elucidated in the description of the figures and in the claims. The individual features may be realized either separately or in combination as embodiments of the invention. Additionally they may describe advantageous implementations which have independent capacity for protection.

SUMMARY OF THE INVENTION

The invention is directed to a fused quartz crucible for pulling a single crystal of silicon according to the Czochralski technique, having an inner side on which there is located an inner layer of fused quartz that forms a surface, the inner layer being provided with a crystallization promoter which on heating of the fused quartz crucible in the context of its designated use, in crystal pulling, brings about crystallization of fused quartz to form β-cristobalite, wherein the concentration C of synthetically obtained $SiO_2$ at a distance d from the surface is greater than the concentration of synthetically obtained $SiO_2$ at a distance d2 from the surface, where d2 is greater than d. The inventive crucible surprisingly yields better quality single crystals when a plurality of crystals are pulled serially.

BRIEF DESCRIPTION OF THE DRAWINGS

FIGS. 2, 3, and 4 illustrate results of measurements obtained when pulling a number of crystals (abscissa) from a crucible

DETAILED DESCRIPTION OF THE PREFERRED EMBODIMENTS

Figure 1:
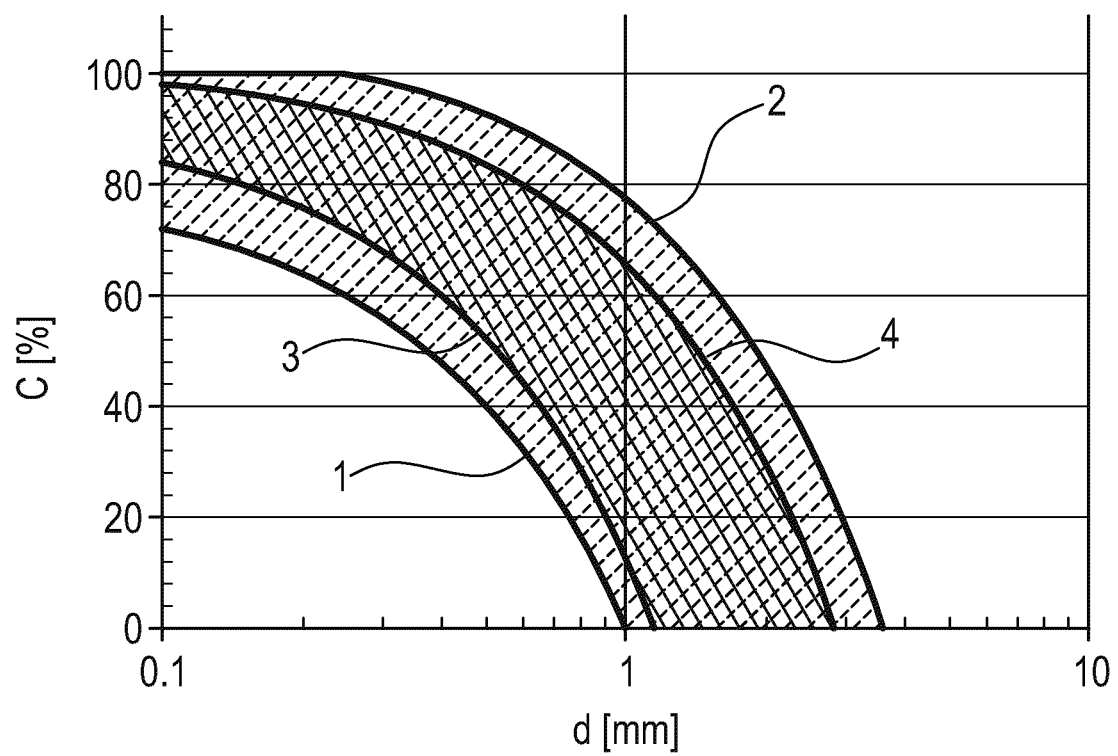
FIG. 1 shows a minimum and maximum concentration C, in accordance with the invention, of the synthetically obtained $SiO_2$, as a function of the distance d from the internal surface of the quartz crucible.

FIG. 1 shows a minimum and maximum concentration C, in accordance with the invention, of the synthetically obtained $SiO_2$, as a function of the distance d from the internal surface of the quartz crucible. The preferred concentration profile is located between curve 1 and curve 2, and the particularly preferred concentration profile is located between curve 3 and curve 4.

An empirical imaging protocol for the respective limits was developed from experimental data.

Curve 1, accordingly, may be mathematically described with the imaging protocol C [%]<=100−(d [mm]−0.25)×30, and curve 2 with the imaging protocol C [%]>=100−(d [mm]+0.25)×80.

The inventors have recognized that even greater effect can be found in the region between curve 3 and curve 4. These curves 3 and 4 can be well described using the respective mathematical protocols C [%]>=100−(d [mm]−0.05)×36 and C [%]<=100−(d [mm]+0.1)×80.

The graphs in FIGS. 2, 3 and 4 illustrate results of measurements obtained when pulling a number of crystals (abscissa) from a crucible.

The ordinates designated "SPV" convey the characteristic mean free path length of the minority charge carriers (SPV) of the respective crystal (abscissa) in relative units based on the maximum value.

The ordinates designated "L" convey the length of the dislocation-free portion of the respective crystal (abscissa).

Crystals for which data is shown in FIGS. 2*a* and 2*b* were pulled using a crucible which—as described in the prior art—was produced from naturally obtained $SiO_2$, and whose inside was coated with a barium-containing component.

While it is found that the length of the dislocation-free portion of the crystals remains high, there is nevertheless a considerable drop apparent in the mean free path length. The mean free path length, then, drops on average to 70% of the initial value. There is therefore no assurance that crystals of uniform quality can be produced with this crucible.

Crystals for which data is shown in FIGS. 3*a* and 3*b* were pulled using a crucible which—as described in the prior art—was produced from synthetically obtained $SiO_2$, and whose inside was coated with a barium-containing component.

The normalized values (FIG. 3*a*) for the free path length show a significantly increased scatter. Even the first crystal from the crucible used shows a mean free path length which is smaller by an average of 10%. Crystals of this quality are inadequate for the semiconductor industry. The length of the dislocation-free portion of the crystals as well (FIG. 3*b*) exhibits an unacceptable scatter and would result in economic damage for a corresponding crucible.

FIGS. 4*a* and 4*b* show the results for crystals pulled with a crucible produced in accordance with the invention.

It is clearly apparent that not only the mean free path length (FIG. 4*a*) but also the portion of the dislocation-free length of the crystals (FIG. 4*b*) exhibit no more than minimum (zero) scatter. Both in terms of quality and economics, the crucibles of the invention are optimal.

A plurality of crystals were pulled in each case from a crucible by means of the Czochralski pulling method and measurements were made both of the mean free path length of the minority charge carriers (SPV) and of the length of the undislocated crystal. The length of the undislocated portion of the crystal was placed in relation to the theoretically attainable overall length.

Similarly, the characteristic mean free path length of the minority charge carriers was placed in relation to the maximum mean free path length measured. This statistic is used below as a quality criterion for any impurities that might be present in the crystal that adversely affect the components subsequently fabricated on the silicon. It would also be possible theoretically to use other statistics for the quality of the crystals. Examples of such include a μPCD lifetime measurement or else a chemical analysis of the resulting silicon by ICP-MS. A number of suitable methods are available here to the skilled person.

The inventors have identified the above-described measurement techniques as being the most suitable and, in particular, readily accessible.

The inventors here have recognized that the use of crucibles manufactured according to the prior art is subject to distinct disadvantages when a crucible is used to pull a number of crystals in succession according to the Czochralski technique. Moreover, crystal pulling appeared to be more difficult the longer the pulling process lasted.

The results of the studies are conveyed in FIG. 2 and FIG. 3.

Crystals for which data is shown in FIGS. 2*a* and 2*b* were pulled using a crucible which—as described in the prior art—was produced from naturally obtained $SiO_2$, and whose inside was coated with a barium-containing component.

While it is found that the length of the dislocation-free portion of the crystals remains high, there is nevertheless a considerable drop apparent in the mean free path length. The mean free path length, then, drops on average to 70% of the initial value. There is therefore no assurance that crystals of uniform quality can be produced with a crucible.

Crystals for which data is shown in FIGS. 3a and 3b were pulled using a crucible which—as described in the prior art—was produced from synthetically obtained $SiO_2$, and whose inside was coated with a barium-containing component.

The normalized values (FIG. 3a) for the free path length show a significantly increased scatter. Even the first crystal from the crucible used shows a mean free path length which is smaller by an average of 10%. Crystals of this quality are inadequate for the semiconductor industry. The length of the dislocation-free portion of the crystals as well (FIG. 3b) exhibits an unacceptable scatter and would result in economic damage for a corresponding crucible.

The inventors have identified crucible material as being a cause of the measured deficiencies and have undertaken extensive trials to eliminate the deficiencies.

It is known from the literature that β-cristobalite has a higher melting temperature than quartz. It is also known that there are certain crystallization promoters which sometimes favor the generation of β-cristobalite.

Another piece of knowledge is that quartz crucibles made from synthetically obtained $SiO_2$ differ in their properties from those quartz crucibles made from naturally obtained $SiO_2$. The results of the experiments are shown for example in FIGS. 2 and 3.

Surprisingly, the inventors found that a fused quartz crucible having an inner side located on which there is an inner layer of fused quartz that forms a surface, the inner layer being provided with a crystallization promoter, exhibits positive properties in relation to the multiple pulling of crystals from a crucible, specifically when the concentration C of synthetically obtained $SiO_2$ at one distance from the surface is greater than the concentration of synthetically obtained $SiO_2$ at another distance from the surface.

Acting as crystallization promoters here with particular preference are the substances barium or strontium, with barium being especially preferred.

The inventors have recognized that it is preferential if the concentration C of synthetically obtained $SiO_2$ is greater than 90% when the distance to the surface is less than 0.4 mm.

Further trials revealed, unexpectedly, that if the concentration of synthetically obtained $SiO_2$ as a function of the distance d is subject to the following relationships:

$C[\%]<=100-(d[mm]-0.25)\times 30$ and $C[\%]>=100-(d[mm]+0.25)\times 80$ there are advantages in relation both to the quality (SPV) and to the portion of dislocation-free length of the crystal. The range just described is depicted in FIG. 1, and relates to the shaded region between curve 1 and curve 2.

Results are depicted, for example, in FIGS. 4a and 4b.

The inventors were able to narrow down the region somewhat, through further experiments, and found that, when the concentration of synthetically obtained $SiO_2$ as a function of the distance d is subject to the following relationships $C[\%]<=100-(d[mm]+0.1)\times 80$ and $C[\%]>=100-(d[mm]-0.05)\times 36$, there are further advantages in relation both to the quality (SPV) and to the portion of dislocation-free length of the crystal.

This region described is also illustrated in FIG. 1, and relates to the shaded region between curve 3 and curve 4.

With particular preference the concentration of the crystal promoter here is less than 1 ppba and greater than 0.05 ppba, based on silicon.

Preferred for producing the fused quartz crucibles of the invention, comprising a crystallization promoter, is a method which involves producing a crucible base body having an inner side and comprising naturally obtained $SiO_2$, and coating the inner side with a layer comprising synthetically obtained $SiO_2$, the concentration C of the synthetically obtained $SiO_2$ increasing with increasing layer thickness.

It is particularly preferred here if the crystallization promoter is added during the actual production of the crucible base body.

For the method it is preferable if the material intended for the coating is mixed continuously in a mixing vessel in order to prevent separation. The proportions of synthetically obtained and naturally obtained $SiO_2$ in the mixing vessel here are altered over time. At the same time, material for the coating is withdrawn from the mixing vessel. The fraction of the synthetically obtained material in the vessel is ideally increased over time.

It has proven to be particularly advantageous for a crystallization promoter to be added during the actual coating of the inner side.

It is particularly preferred if, subsequent to the coating, the crucible is filled with polysilicon and is heated to above 1400° C. in order to melt the polysilicon.

It is especially preferred for the polysilicon to be admixed additionally with a crystallization promoter, preferably comprising barium, with a concentration of greater than 0.5 ppba and less than 10 ppba, based on the polysilicon.

What is claimed is:

1. A fused quartz crucible for pulling a single crystal of silicon according to the Czochralski technique, comprising:
    an inner side on which there is located an inner layer comprising fused natural quartz and synthetically obtained $SiO_2$, forming an inner surface, the inner layer being provided with a crystallization promoter which on heating of the fused quartz crucible during a crystal pulling, brings about crystallization of fused natural quartz and synthetically obtained $SiO_2$ to form ß-cristobalite, wherein the concentration C of synthetically obtained $SiO_2$ at a distance d from the inner surface of the inner layer is greater than the concentration of synthetically obtained $SiO_2$ at a distance d2 from the surface of the inner layer, where d2 is greater than d, and the concentration C of synthetically obtained $SiO_2$ as a function of the distance d within the inner layer is subject to the following relationships:

$C[\%]<=100-(d[mm]-0.25)\times 30$ and $C[\%]>=100-(d[mm]+0.25)\times 80$.

2. The fused quartz crucible of claim 1, wherein said crystallization promoter comprises barium or strontium.

3. The fused quartz crucible of claim 1, wherein the concentration C of synthetically obtained $SiO_2$ is greater than 90% when the distance d to the surface is less than 0.4 mm.

4. The fused quartz crucible of claim 1, wherein the concentration C of synthetically obtained $SiO_2$ as a function of the distance d is subject to the following relationships:

$C[\%]<=100-(d[mm]+0.1)\times 80$, and $C[\%]>=100-(d[mm]-0.05)\times 36$.

5. The fused quartz crucible of claim 1, wherein the concentration C of synthetically obtained $SiO_2$ as a function of the distance d is subject to the following relationships:

$$C[\%] <= 100-(d[mm]+0.1) \times 80, \text{ and}$$

$$C[\%] >= 100-(d[mm]-0.05) \times 36.$$

6. The fused quartz crucible of claim 1, wherein the concentration of the crystal promoter is less than 1 ppba and greater than 0.05 ppba, based on silica in the fused quartz crucible.

7. The fused quartz crucible of claim 1, wherein the crystal promoter comprises barium.

8. A method for producing a fused quartz crucible comprising a crystallization promotor of claim 1, comprising:
producing a crucible base body which has an inner side and comprises naturally obtained $SiO_2$,
and coating the inner side with a layer comprising synthetically obtained $SiO_2$, the concentration C of the synthetically obtained $SiO_2$ increasing with increasing layer thickness,
wherein the material for the coating is mixed continuously in a mixing vessel in order to prevent separation, with fractions of synthetically obtained and naturally obtained $SiO_2$ in the mixing vessel being altered over time and at the same time withdrawing material from the mixing vessel for the coating.

9. The method of claim 8, wherein the crystallization promoter is added during the production of the crucible base body.

10. The method of claim 9, wherein the polysilicon is additionally admixed with a crystallization promoter having a concentration greater than 0.5 ppba and less than 10 ppba, based on the polysilicon.

11. The method of claim 8, wherein during said coating of the inner side, a crystallization promoter is added.

12. The method of claim 8, wherein subsequent to the coating with the layer comprising synthetically obtained $SiO_2$, the crucible is filled with polysilicon and is heated to above 1400° C. in order to melt the polysilicon.

13. The method of claim 8, wherein the crystallization promoter comprises barium.

14. A method for producing semiconductor wafers, characterized in that an ingot is pulled in a crystal pulling unit using a fused quartz crucible of claim 1, the ingot is cut into wafers by means of a wire saw, the wafers are polished, optionally subjected to epitaxy.

15. A two-layer fused quartz crucible for pulling a single crystal of silicon according to the Czochralski's technique, comprising:
an outer opaque layer comprising fused natural quartz, and an inner transparent layer comprising synthetic silica, wherein the synthetic silica content in the transparent layer varies with a distance d from an inner surface of the transparent layer such that the concentration C of synthetic silica in the transparent layer as a function of d satisfies the following relationships:

$$C[\%] <= 100-(d[mm]-0.25) \times 30 \text{ and}$$

$$C[\%] >= 100-(d[mm]+0.25) \times 80,$$

and an area near the inner surface of the transparent layer has a higher concentration of synthetic silica than an area closer to an inner surface of the first, outer opaque layer, and wherein the transparent layer further comprises a barium or strontium crystallization promoter within the transparent layer.

16. The two-layer fused quartz crucible of claim 15, wherein the concentration of synthetic silica is greater than 90% at all distances less than 0.4 mm from the inner surface of the transparent layer.

17. The two-layer fused quartz crucible of claim 15, further comprising a crystallization promoter within the first opaque outer layer.

18. The two-layer fused quartz crucible of claim 15, wherein the concentration C of synthetic silica in the transparent layer satisfies, with respect to d, the following relationships:

$$C[\%] <= 100-(d[mm]+0.1) \times 80, \text{ and}$$

$$C[\%] >= 100-(d[mm]-0.05) \times 36.$$

19. The two-layer fused quartz crucible of claim 15, wherein the concentration of crystallization promoter within the transparent layer is from 0.05 ppba to 1 ppba prior to the crucible's first use in pulling a single crystal of silicon.

* * * * *